United States Patent
Chen et al.

(10) Patent No.: US 7,354,822 B2
(45) Date of Patent: Apr. 8, 2008

(54) METHOD OF FORMING A MOSFET WITH DUAL WORK FUNCTION MATERIALS

(75) Inventors: Xiangdong Chen, Poughquag, NY (US); Geng Wang, Beacon, NY (US); Yujun Li, Poughkeepsie, NY (US); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 11/553,072

(22) Filed: Oct. 26, 2006

(65) Prior Publication Data

US 2007/0051996 A1    Mar. 8, 2007

Related U.S. Application Data

(62) Division of application No. 10/622,477, filed on Jul. 18, 2003, now Pat. No. 7,294,879.

(51) Int. Cl.
  *H01L 21/8242* (2006.01)
(52) U.S. Cl. ............... 438/243; 438/244; 438/386; 438/387; 257/E21.651; 257/E21.652
(58) Field of Classification Search ............... 438/246, 438/389; 257/E21.4
See application file for complete search history.

(56) References Cited

U.S. PATENT DOCUMENTS

| 6,808,979 | B1 * | 10/2004 | Lin et al. | 438/242 |
| 6,960,503 | B2 * | 11/2005 | Hsu et al. | 438/243 |
| 2005/0285175 | A1 * | 12/2005 | Cheng et al. | 257/302 |

OTHER PUBLICATIONS

H. Akatsu et al., "A Highly Manufacturable 110nm DRAM Technology with 8F2 Vertical Transistor Cell for 1Gb and Beyond". IEEE 2002 Symposium on VLSI Technology Digest of Technical Papers.
K. McStay et al., "Vertical Pass Transistor Design for Sub-100nm DRAM Technologies", IEEE 2002 Symposium on VLSI Technology Digest of Technical Papers.
J.A. Mandelman et al., "Challenges and Future Directions for the Scaling of Dynamic Random-Access Memory (DRAM)", IBM Journal of Research and Development, vol. 46, No. 2/3, Mar./May 2002, pp. 187-208.

* cited by examiner

*Primary Examiner*—Michael Lebentritt
*Assistant Examiner*—Cheung Lee
(74) *Attorney, Agent, or Firm*—H. Daniel Schnurmann

(57) ABSTRACT

A vertical pass transistor used in a DRAM cell for maintaining a low total leakage current and providing adequate drive current is described together with a method of fabricating such a device. The transistor gate is engineered in lieu of the channel. The vertical pass transistor for the DRAM cell incorporates two gate materials having different work functions. The gate material near the storage node is n-type doped polysilicon. The gate material near the bit line diffusion is made of silicide or metal having a higher work function than the n-polysilicon. The novel device structure shows several advantages: the channel doping is reduced while maintaining a high Vt and a low sub-threshold leakage current; the carrier mobility improves with the reduced channel doping; the body effect of the device is reduced which improves the write back current; and the sub-threshold swing is reduced because of the low channel doping.

8 Claims, 13 Drawing Sheets

Well, source, and buried plate implant

METHOD OF FORMING A MOSFET WITH DUAL WORK FUNCTION MATERIALS

CROSS REFERENCE TO RELATED APPLICATIONS

This application is a divisional of U.S. patent application Ser. No. 10/622,477 filed Jul. 18, 2003, hereby incorporate herein by reference now U.S. Pat. No. 7,294,879.

BACKGROUND OF THE INVENTION

This invention relates to semiconductor transistors, and more particularly, to a vertical pass transistor having a gate with dual work function materials for use in Dynamic Random-Access Memory (DRAM) cell applications.

DRAM pass transistors require off-state leakage current of less than 1 fA per cell to achieve an adequate retention time. The scaling of channel length requires higher channel doping to control short channel effect and sub-threshold leakage. Increasing channel doping results in a degraded retention time due to junction leakage. These and other constraints present a challenge when designing planar pass transistor at below 100 nm node, as described in an article by J. Mandelman et al., "Challenges and future directions for the scaling of dynamic random-access memory (DRAM)," IBM Journal of Research and Development, Vol. 46, (2002), pp. 187-213. A vertical pass transistor coupled to a deep trench capacitor cell design is an alternative for continuous scaling of DRAM technology because the channel length of the pass transistor is decoupled from the minimum feature size or the DRAM cell size. Doping of the vertical channel can be achieved by ion implant through the sacrificial oxide before the array top oxide and the wordline stack deposition.

FIG. 1 illustrates a conventional vertical pass transistor DRAM cell. Shown therein is a vertical pass transistor positioned above the deep trench capacitor. The pass transistor is connected to the storage node of the capacitor by an N+ diffusion region, referred to as buried strap. The gate of the pass transistor is made of a single work function material, usually N+ doped polysilicon. The gate material of the transistor is isolated from the conductor within the deep trench capacitor by a trench top oxide. A thick collar oxide separates the buried strap N+ diffusion region from the N+ doped buried plate. The gate material at the top part of the deep trench is surrounded by a nitride spacer.

Several components of the leakage as seen by the storage node diffusion are:

Sub-threshold leakage:

To retain a logic "1" when the wordline and bitline are both at ground requires that the MOSFET threshold voltage (Vt) be at least 0.8V. The threshold voltage is provided by the following equation:

$$V_t = \phi_m - \phi_s - Q_{ox}/C_{ox} + 2\psi_B + (4\epsilon_{si}qN_a\psi_B)^{1/2}/C_{ox}, \quad (1)$$

wherein $\phi_m$ and $\phi_s$ are work functions of the material forming the gate and of the silicon substrate. $Q_{ox}$ represents the charge in the gate dielectric, and $C_{ox}$ is the gate dielectric capacitance. $\psi_B$ is the difference of potential between Fermi's level and the intrinsic Fermi level. $N_a$ is the doping concentration in the channel.

In prior art DRAM technology, N+ doped polysilicon must be used as the gate material and P-type doped silicon is required for the channel. The work function of the N+ polysilicon is approximately 4.05V, and the work function of the P-type doped silicon is:

$$\phi_s = 4.05 + 0.56 + \psi_B. \quad (2)$$

Therefore, $$\phi_m - \phi_s = 0.56 + \psi_B \quad (3)$$

With N+ polysilicon used as gate material, a high channel doping must be used to achieve a high Vt while the high channel doping can lead to high junction leakage, low carrier mobility and high back bias sensitivity. The latter two effects degrade the write back current.

Another approach to prevent a sub-threshold leakage is to place the wordline at a negative voltage when a "1" is retained in the storage node, and the bit line is at zero volts while the negative wordline-low increases the GIDL current.

Junction leakage.

The junction leakage between the diffusion region and the channel limits the channel doping.

Gate induced drain leakage (GIDL).

GIDL current in the diffusion regions limits the use of negative wordlines.

Therefore, it becomes a challenge to prevent the three previously mentioned leakages and still maintain an appropriate write back current. A solution to the above challenge is to engineer the channel, as described, e.g., by K. MacStay et al., in the article "Vertical Pass Transistor Design for Sub-100 nm DRAM Technologies", Symposium on VLSI Technology Digest of Technical Papers, p. 180, 2002. McStay selects the channel doping to have a peak concentration at the top of the channel near the bit line diffusion. Thus, the Vt adjustment implant and the doping near the storage node are partially decoupled. There are still others disadvantages regarding this method. First, there remains a large body effect for the device which degrades the write back current. Second, the Vt adjustment implant cannot be totally decoupled from the doping near the storage node as a result of the diffusion of the channel dopant being boron.

To reduce the body effect and improve the write back current, an angled Vt implant into the deep trench side-wall is used to generate a non-uniform doping in a lateral direction. The doping concentration near the surface of the side-wall is high while the Vt and channel doping away from the surface of the channel is low, which reduces the body effect and improves the write back current. The difficulty of this design is that Vt of the device is highly sensitive to the deep trench top recess depth which, from a process point of view, is difficult to control.

A negative wordline low is effective in reducing the channel doping while keeping the sub-threshold leakage low. While the negative wordline voltage causes a large gate induced drain leakage (GIDL) current and degrades the retention performance, having a negative wordline voltage in a DRAM pass gate is not possible.

OBJECTS AND SUMMARY OF THE INVENTION

Accordingly, it is an object of the invention to provide a vertical MOSFET for DRAM applications which incorporates two gate materials having different work functions.

It is another object to provide a method of fabricating a dual work function vertical MOSFET transistor.

It is yet another object to provide a method for optimizing the work function material for a vertical transistor in a DRAM cell in terms of its effect on the threshold voltage.

It is still another object to suppress all leakage current components and maintain an adequate write back current in the vertical DRAM pass transistor.

The invention described herein provides a method for maintaining a low total leakage current and enough drive current at the same time for the vertical DRAM pass transistor. The transistor gate is engineered in lieu of the channel, as described by K. McStay et al. The vertical pass transistor for the DRAM cell incorporates two gate materials having different work functions. The gate material near the storage node is n-type doped polysilicon. The gate material near the bit line diffusion is made of some silicide or metal materials which have higher work function than the n-polysilicon. The work function of different metal and silicide materials are listed in Table I. With the high work function gate material near the bit line diffusion, the Vt of the transistor can be kept high enough in the presence of a low channel doping. The novel device structure presents several advantages:

The channel doping can be reduced while keeping a high Vt and a low sub-threshold leakage current. As can be seen from equation (1), the threshold voltage Vt of the MOSFET can increase by increasing the work function of the gate. With dual work function gate materials, Vt differs near the source side and the drain side. The final Vt for the device is mainly decided by the source side Vt. Herein, a higher work function material is used near the source side (bit line diffusion region) with Vt kept sufficiently high with a low channel doping. Because the gate material near the storage node is still N+ polysilicon, the electric field near the storage node does not increase and GIDL remains low.

The carrier mobility improves with the reduced channel doping.

The body effect of the device is reduced, thereby improving the write back current.

The sub-threshold swing is reduced because of the low channel doping. With the same Vt, the off-state leakage current is likewise reduced.

The junction leakage and GIDL is suppressed due to reduced channel doping.

Both lower off-state leakage current and higher drive current are achieved with the device structures of the present invention.

In an aspect of the invention there is provided a DRAM cell that includes: a vertical MOSFET transistor on a substrate having an N doped region forming a buried plate, said vertical transistor being provided with an N+ type doped drain, a P type doped well above said buried plate, and an N+ type doped region forming the transistor source; a deep trench formed within said substrate, said deep trench having a collar separating said drain from said buried plate, said deep trench having an insolated first region filled with polysilicon and a second region on top of said insulated first region forming said gate, wherein said gate is formed by dual work function materials In another aspect of the invention there is provided a method of fabricating a DRAM cell that includes the steps of: a) forming a deep trench capacitor within a substrate, said deep trench being partially filled with polysilicon and topped by a trench top oxide; b) forming a vertical transistor by diffusing a drain adjoining to the outer surface of said deep trench and contiguous to said trench top oxide; c) forming said vertical transistor gate oxide on the walls of said deep trench; d) filling the upper portion of said deep trench with a first gate material to a first height of said deep trench, and a second gate material on top of said first gate material, said second gate material only partially filling said deep trench to a second height of said deep trench, said first and second heights being less than the total depth of said deep trench; e) forming spacers on the exposed walls of said deep trench; f) filling the remainder of said deep trench contacting said uppermost gate material with conductive material, said uppermost gate material being surrounded by said spacers; and g) successively implanting into said substrate a buried plate, a well, and said transistor source.

BRIEF DESCRIPTION OF THE DRAWINGS

The accompanying drawings, which are incorporated in and which constitute a part of the specification, illustrate presently preferred embodiments of the invention and, together with the general description given above and the detailed description of the preferred embodiments given below; serve to explain the principles of the invention.

DETAILED DESCRIPTION OF THE INVENTION

The present invention described a vertical DRAM pass transistor having two different gate work function materials and a method of fabrication thereof.

In a first embodiment, N+ doped polysilicon is used for the gate near the storage node. Above the N+ gate polysilicon, another gate material with a higher work function, such as silicide, is used to control Vt for the transistor. The metal and silicide gate materials with higher work function that can be advantageously used as dual work function gate materials, according to the present invention, are shown in Table I.

TABLE I

| Metal | Workfunction (V) | Silicide | Workfunction (V) |
|---|---|---|---|
| Al | 4.71-4.81 | $CrSi_2$ | 4.64 |
| Au | 4.9 | $MoSi_2$ | 4.62 |
| Cr | 4.65 | $NiSi_2$ | 4.72 |
| Mo | 4.65 | $Pd_2Si_2$ | 4.78 |
| Ti | 4.57 | PtSi | 4.9 |
| W | 4.67 | $TiSi_2$ | 4.65 |
|   |   | $WSi_2$ | 4.7 |

Figure 2:
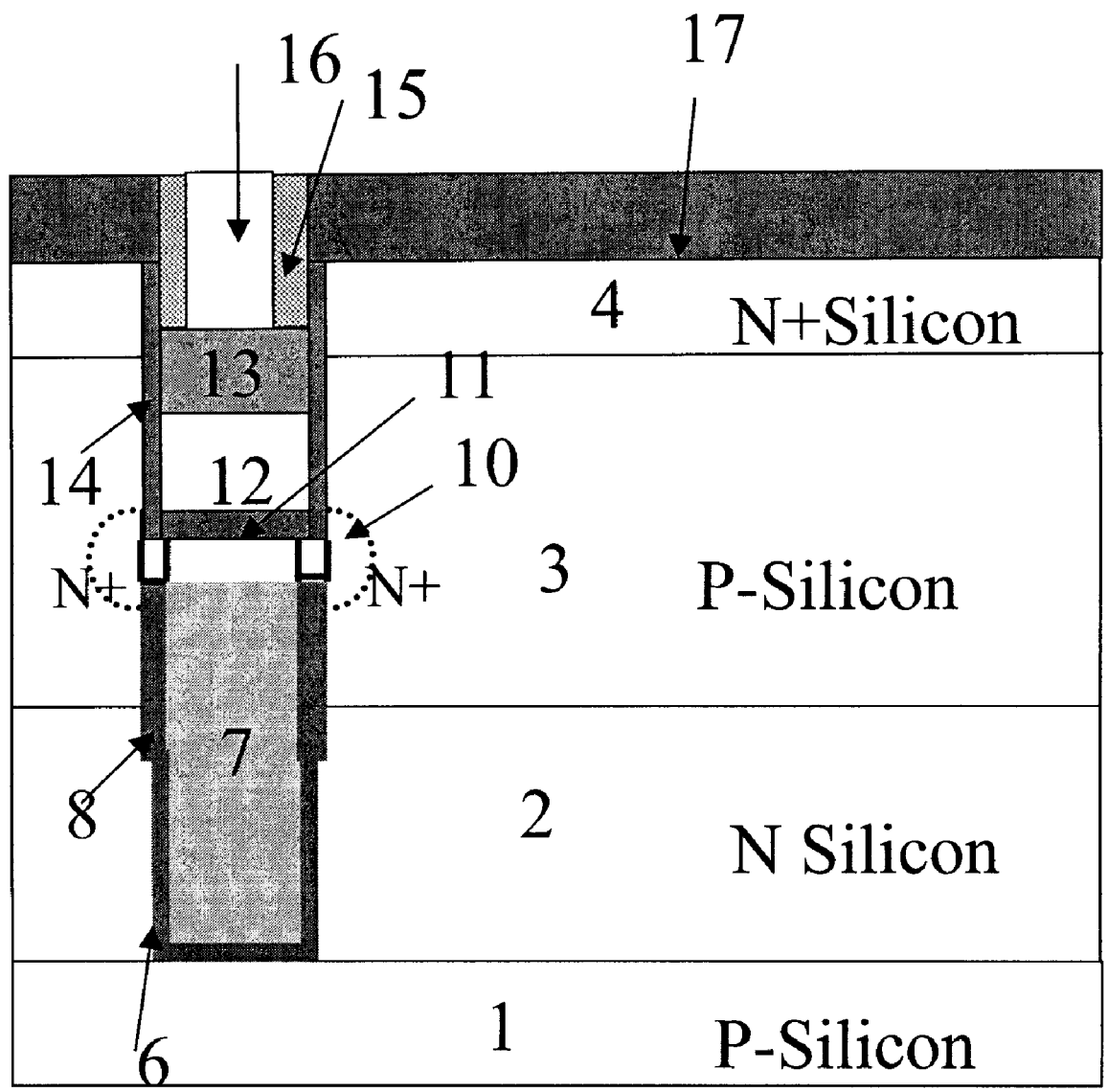
FIG. 2 shows a schematic cross-section of dual work function material DRAM vertical pass transistor on deep trench capacitor, according to the present invention. . . .

Referring now to FIG. 2, there is shown a cross-section view of the vertical pass transistor at the DRAM storage node. The vertical pass transistor is fabricated coupled to a deep trench capacitor, with source 4 and drain 10 separated by a channel region 3 over which a dual material gate 12, 13 is formed on gate oxide 14. The vertical pass transistor is connected to the capacitor through an N+ diffusion region 10. The gate conductor for the pass transistor made of two different gate materials 12, 13 is constructed such that gate material 12 is separated from the capacitor by oxide layer 11, also referred to as trench top oxide layer.

Figure 3A:
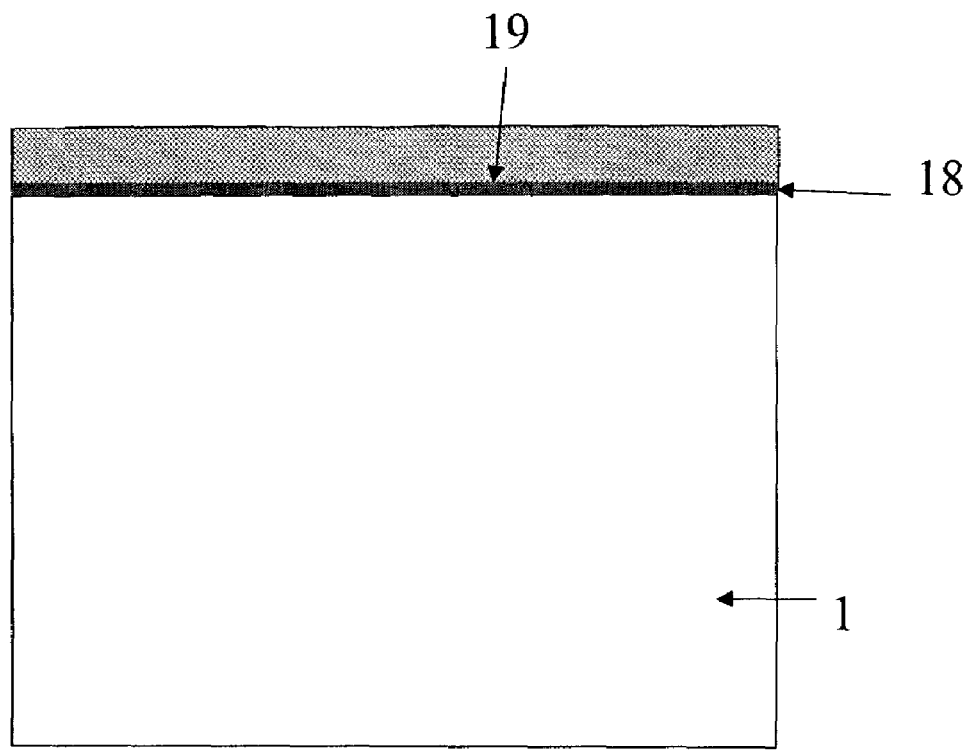
FIGS. 3A-3V illustrate the process flow to fabricate a dual work function material DRAM vertical pass transistor.
Figure 3B:
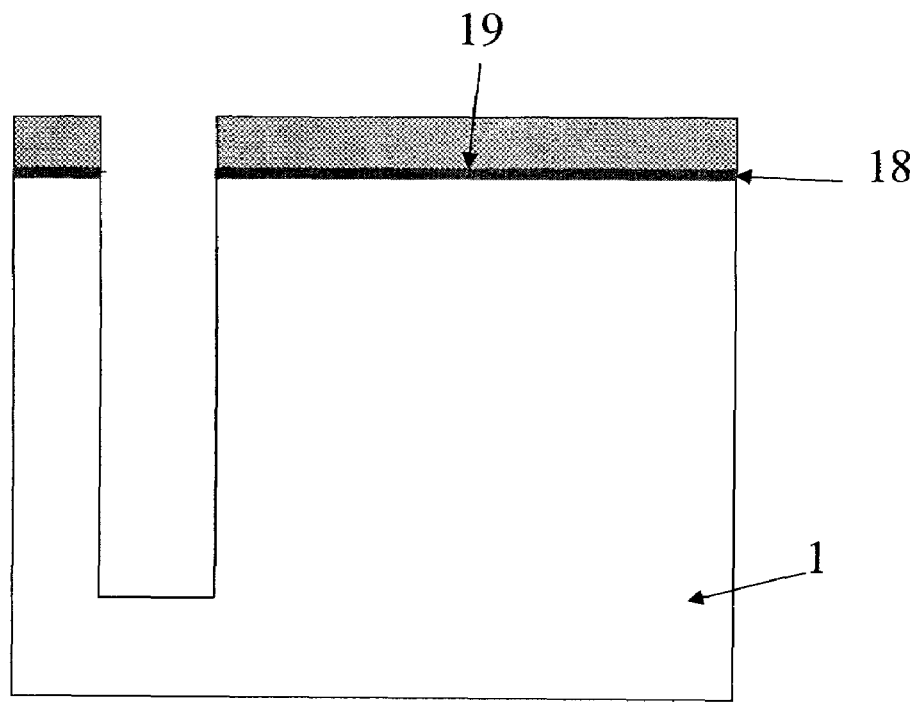
Figure 3C:
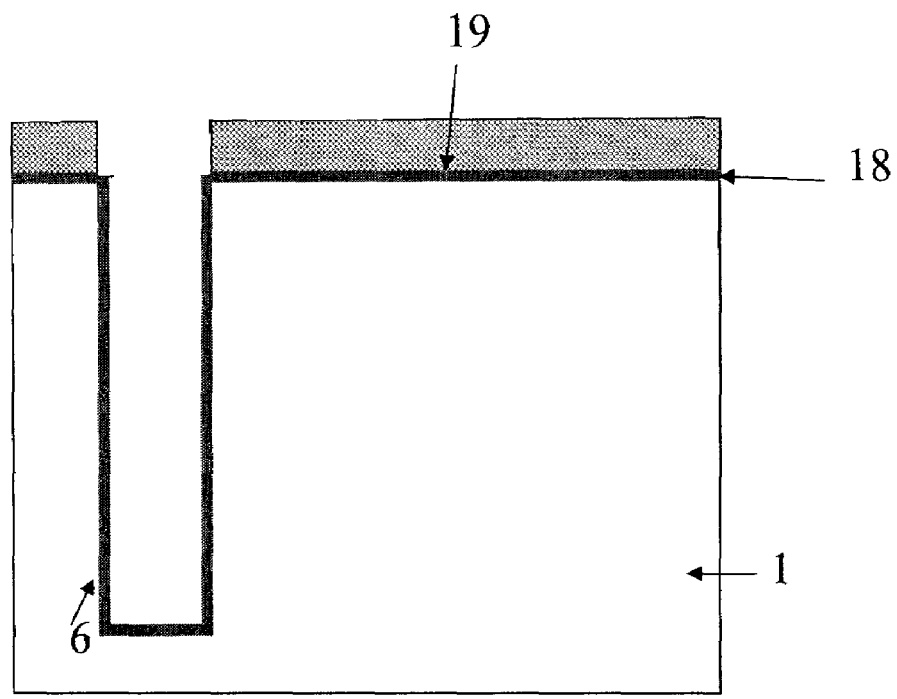
Figure 3D:
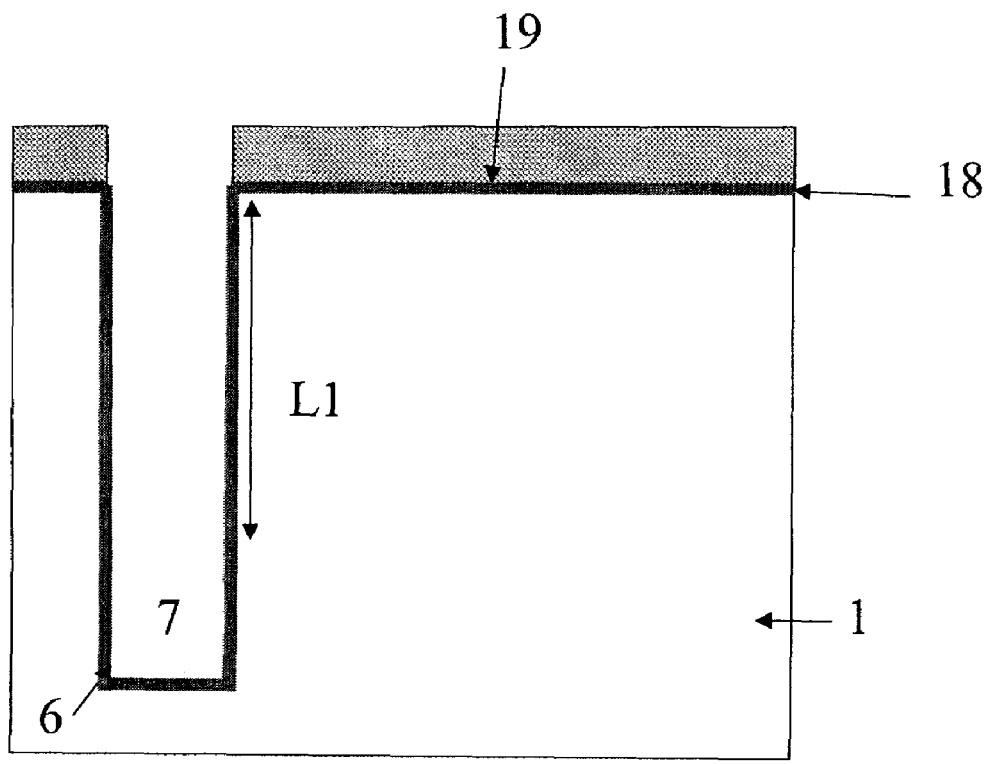
Figure 3E:
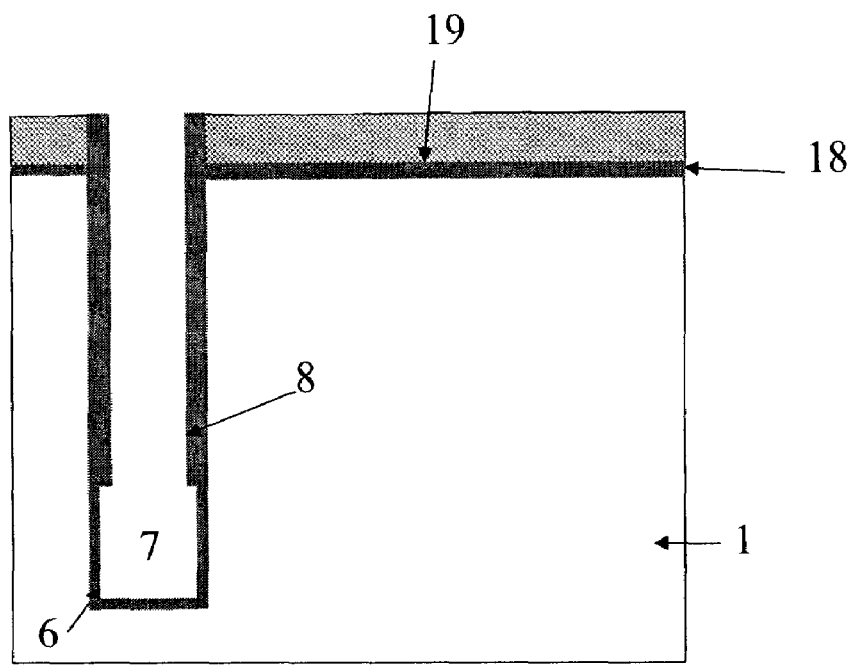
Figure 3F:
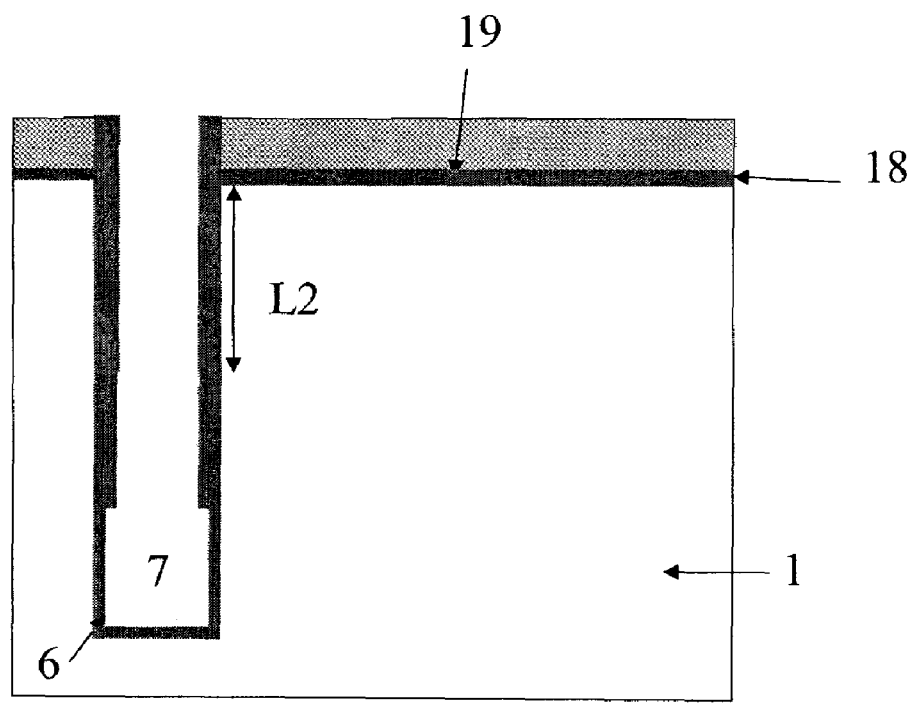
Figure 3G:
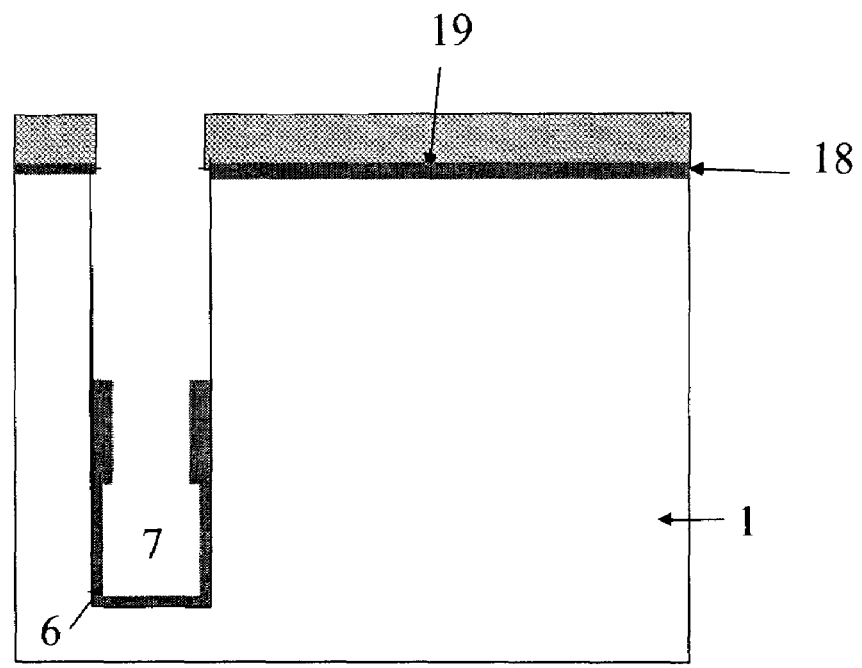
Figure 3H:
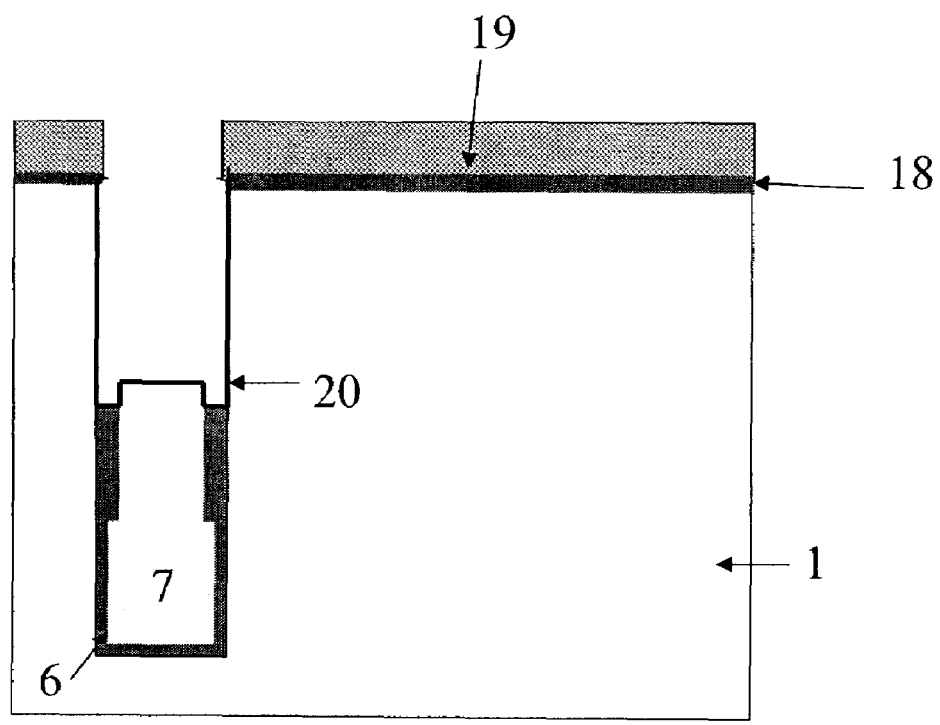
Figure 3:
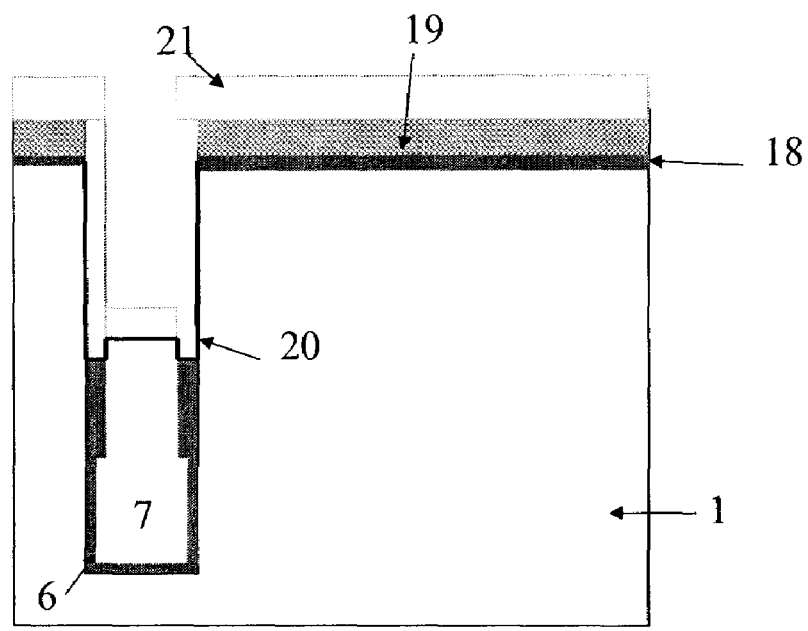
Figure 3:
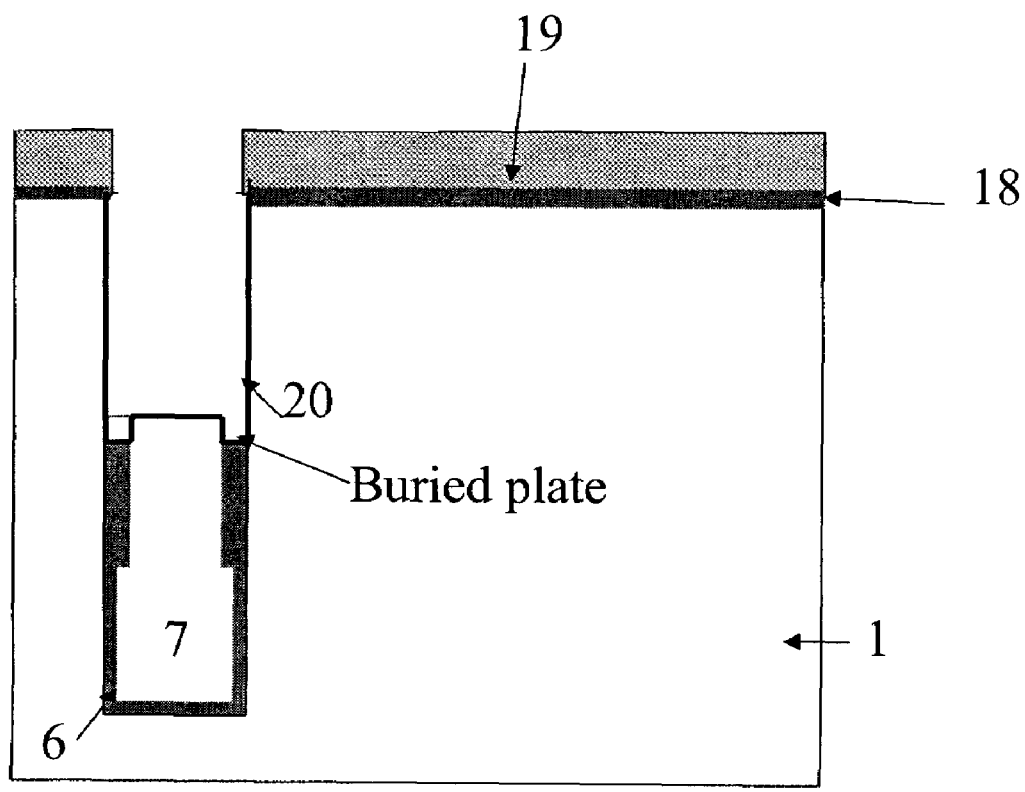

The process flow is shown in FIG. 3. The process starts with a P-type doped Si substrate 1. Referring to FIG. 3A, pad oxide 18 and pad nitride 19 are grown on top of the silicon substrate. The pad oxide 18 is used as a stress relief layer between the silicon substrate and the pad nitride. The pad oxide is preferably formed by furnace dry oxidation, while the pad nitride is formed by chemical vapor deposition (CVD).

After deep trench lithography and patterning, deep trenches are formed on the substrate by reactive ion etch (RIE) (FIG. 3B).

Node dielectric 6 is then grown on the side-wall of the deep trench (FIG. 3C). The dielectric can be oxide or any other high dielectric material in order to improve the gate capacitance.

Referring to FIG. 3D, an N+ in-situ doped polysilicon is deposited at the bottom of the deep trench, preferably by CVD and recessed by RIE. The recess depth L1 combined with the deep trench depth determines the storage capacitor area.

In FIG. 3E, a thick oxide layer is deposited by CVD around the side-wall of the capacitor. The oxide above the polysilicon 7 and pad nitride are etched away by reactive ion etch. The thick oxide layer 8, referred to as collar oxide, remains on the side-wall of deep trench. The collar oxide provides vertical isolation between the deep trench capacitor and the vertical pass transistor.

In FIG. 3F, an in-situ doped N+ polysilicon layer is deposited by CVD and again recessed by RIE. The recess depth L2 determines the channel length of the pass transistor. Accordingly, the channel length of the pass transistor is not defined by lithography.

Referring to FIG. 3G, the collar oxide above the polysilicon on the side-wall is etched away by wet etch to provide an adequate amount of space to form the buried and vertical transistors. The collar oxide ends somewhere below the polysilicon due to the wet over-etch process.

In FIG. 3H, a very thin nitride layer is deposited on top of polysilicon 7 by a CVD process. This nitride layer acts as a diffusion barrier of the buried strap to the silicon P-well. It is also used as the polysilicon etch stop layer in the following step.

Referring now to FIG. 3I, another in-situ doped N+ polysilicon layer 21 is deposited to form the buried strap and the N+ diffusion region which connects the pass transistor to the storage capacitor.

Wet etch is then used to etch polysilicon 21 and form the structure shown in FIG. 3J. The N-type dopant in the buried strap diffuses into the silicon to form an N-type doped diffusion layer (10 in FIG. 2) with a later thermal process.

Figure 3K:
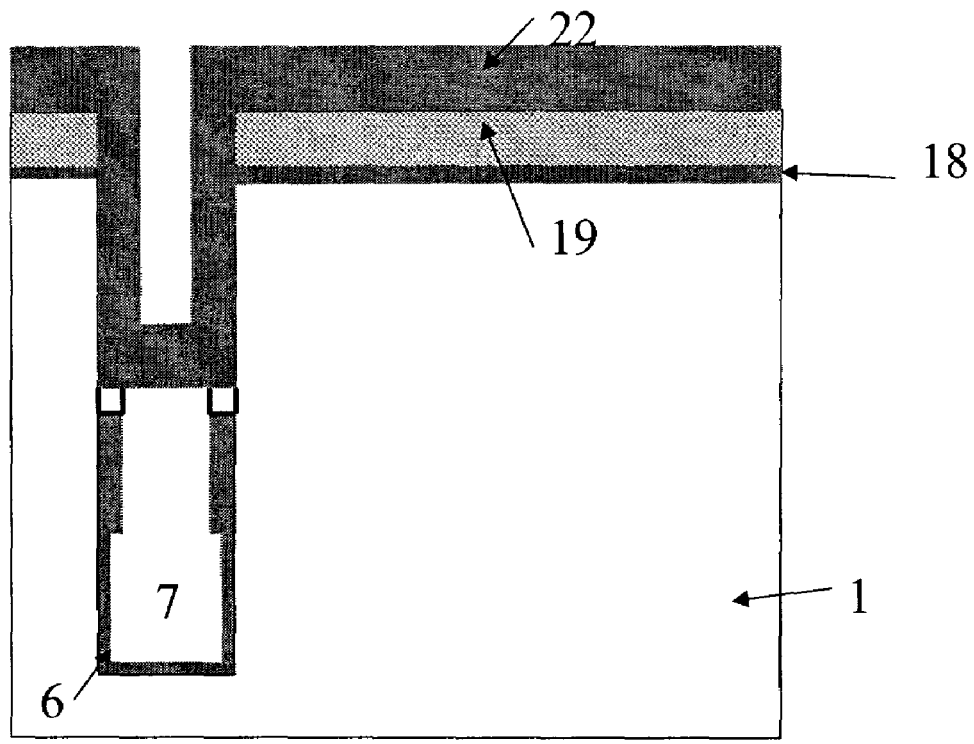

In FIG. 3K, oxide layer 22 is deposited by high density plasma chemical vapor deposition (HDPCVD).

Figure 3L:
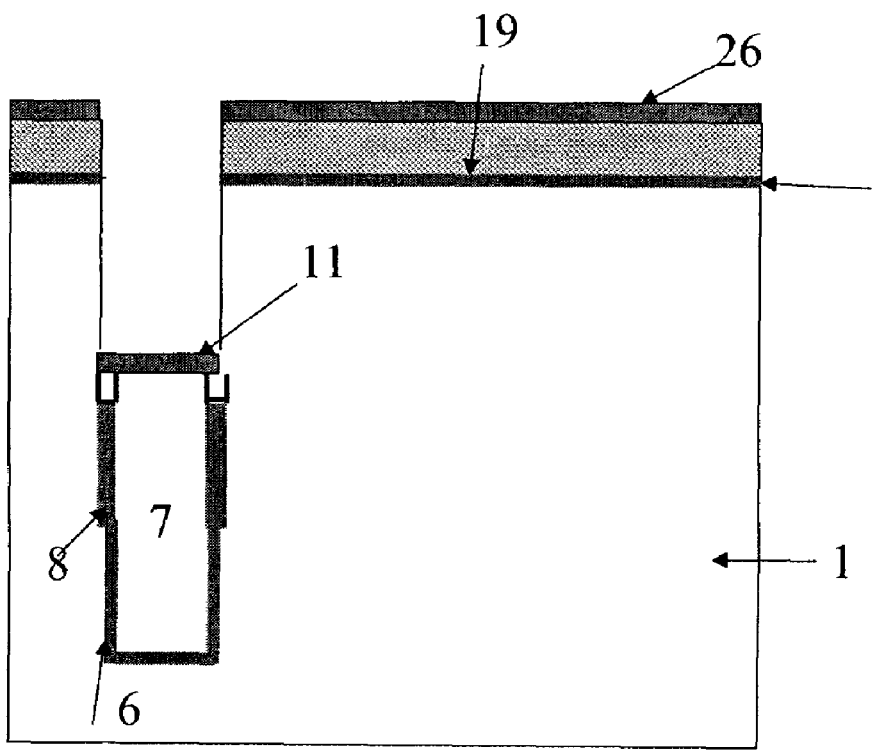

Referring now to FIG. 3L, wet etch is used once again to etch away the oxide on the side-wall. Trench top oxide 11 is then formed above polysilicon 7.

Figure 3M:
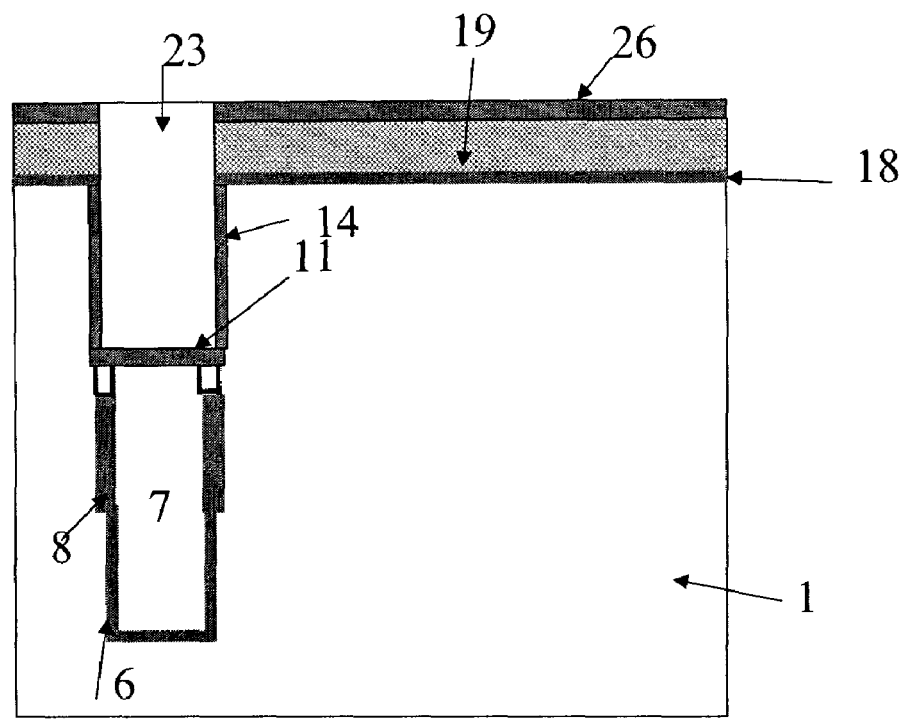

This completes the construction of the deep trench capacitor. Gate oxide 14 is now formed on the side wall of the trench, as shown in FIG. 3M. The gate oxide can be formed by furnace dry oxidation. An in-situ doped N+ polysilicon 23 is deposited by chemical vapor deposition (CVD) and planarized by way of chemical mechanical polishing (CMP) (FIG. 3M). The oxide 26 on the pad nitride acts as a stop layer for the CMP process of the polysilicon.

Figure 3N:
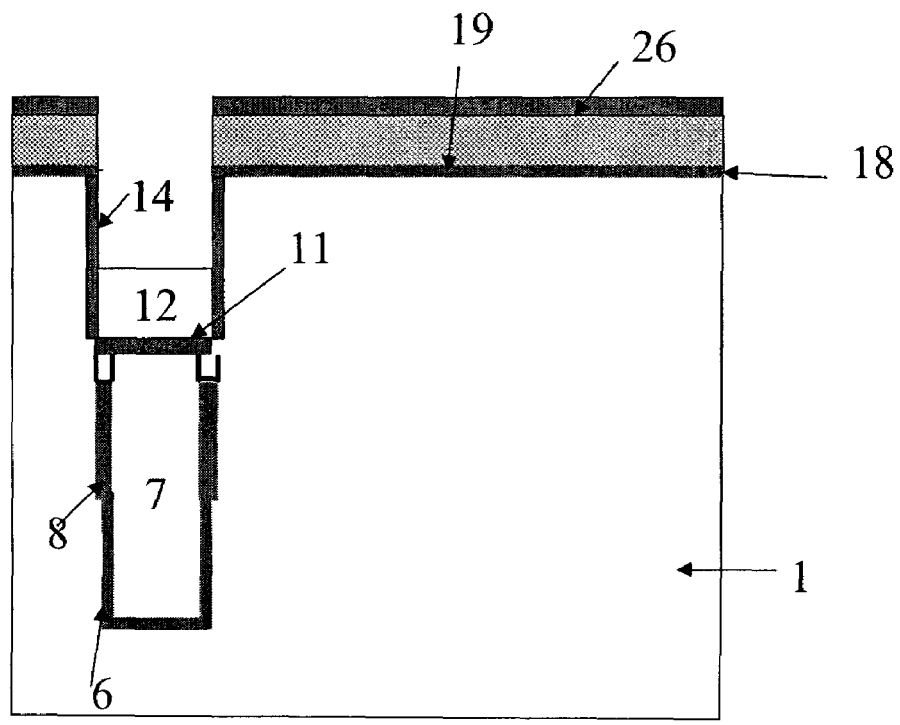
Figure 3:
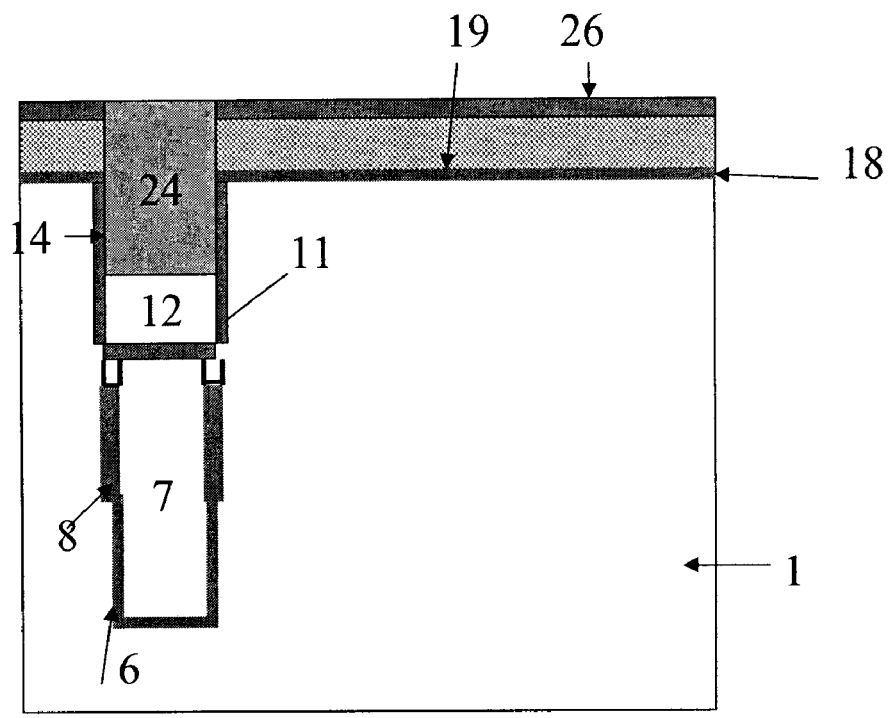

In the next step, N+ polysilicon is recessed by RIE as shown in FIG. 3N. The left N+ polysilicon 12 is used as the first gate material. Near the storage node, the gate material is the same as what is used in the prior art, namely, N+ doped polysilicon.

Referring now to FIG. 3O, the inventive step calls for a second gate material 24 having a higher work function, such as W, to be deposited by chemical vapor deposition. The surface is then planarized by chemical mechanical polishing. The oxide above the pad nitride acts as a stop layer in the planarization process for gate material 24.

Figure 1:
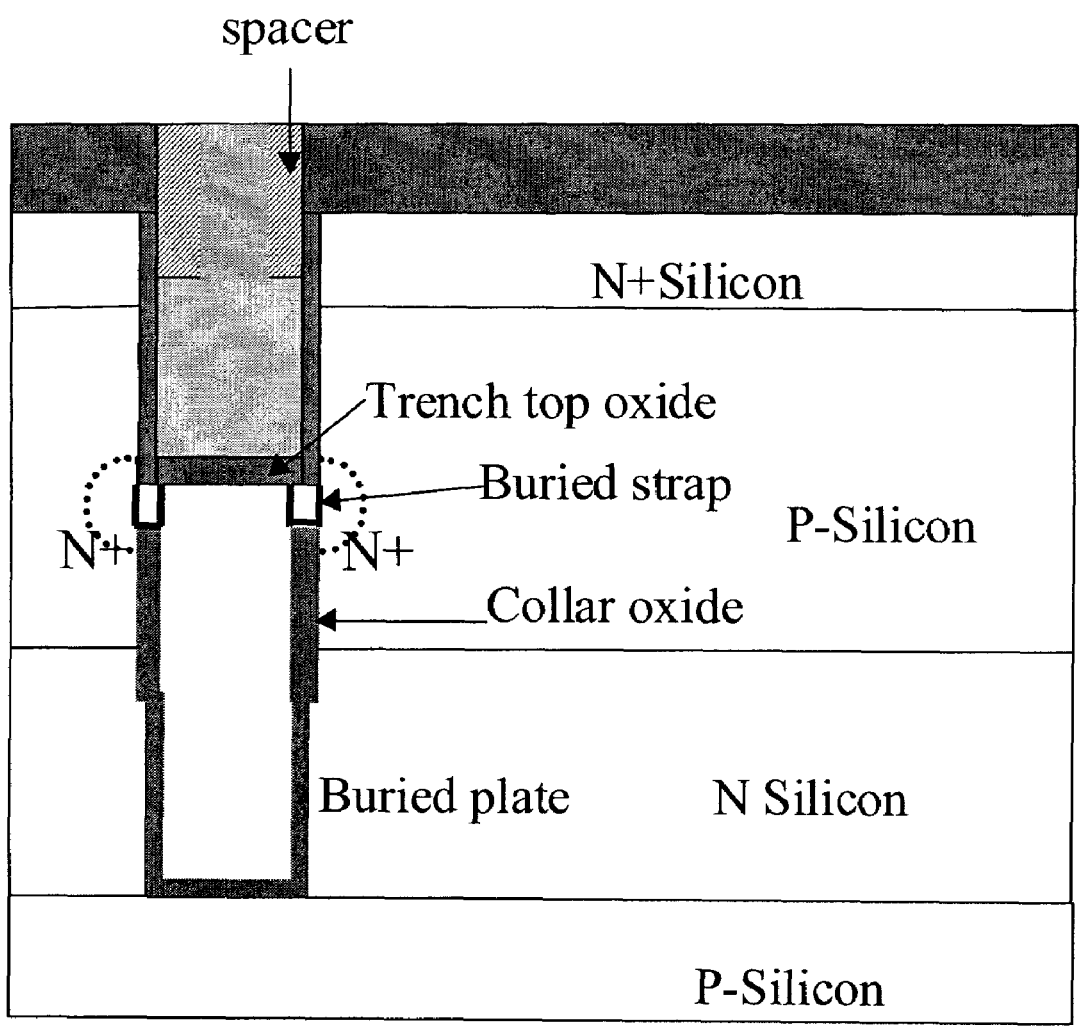
FIG. 1 shows a schematic of a cross section of a prior art technology vertical transistor and deep trench DRAM cell.
Figure 3P:
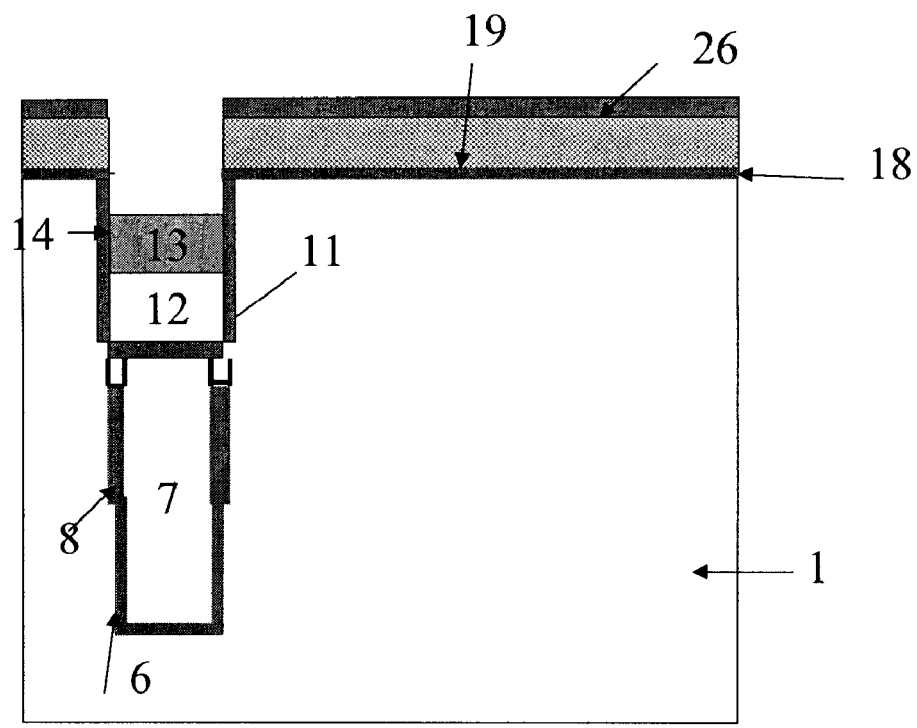

Gate material 24 is recessed by RIE (FIG. 3P). The depth of the recess determines the overlap between the gate 12,13 and the source (4 in FIG. 1).

Figure 3Q:
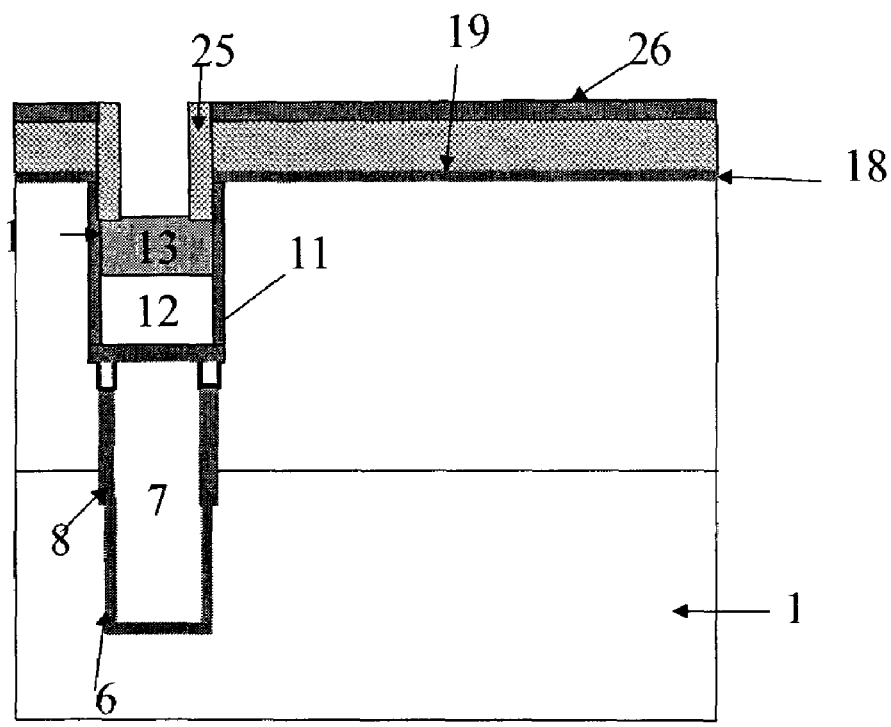

Next, another silicon nitride layer is deposited by CVD, and a spacer 25 is then formed by RIE, as shown in FIG. 3Q.

Figure 3R:
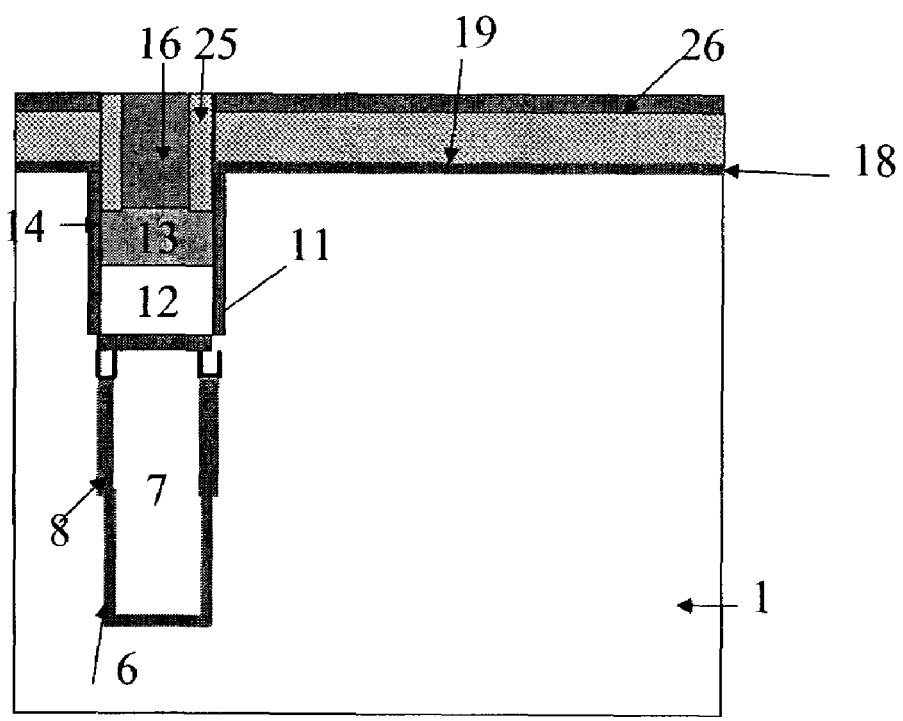

Referring to FIG. 3R, another N+ polysilicon layer 16 is deposited by CVD and planarized by CMP.

Figure 3S:
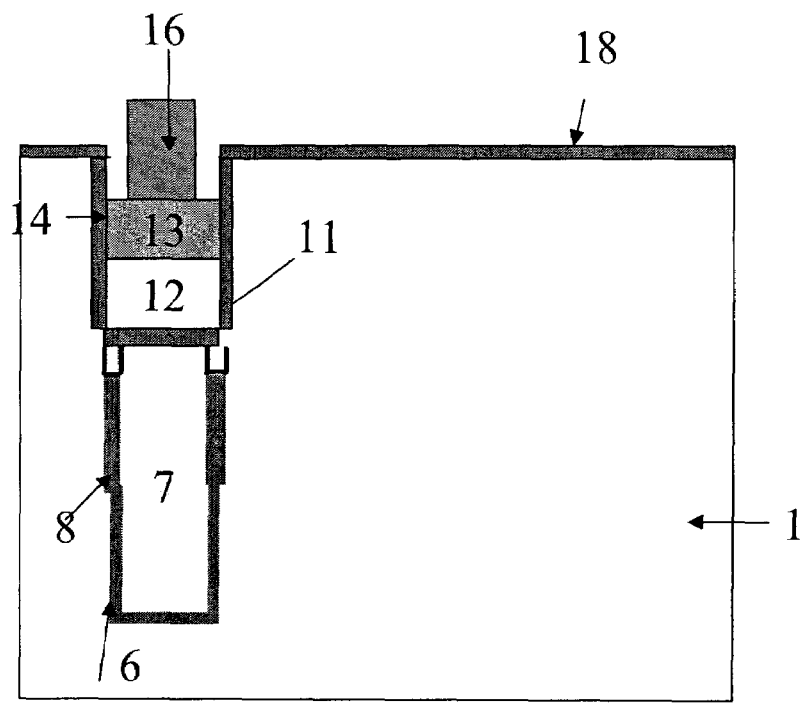
Figure 3T:
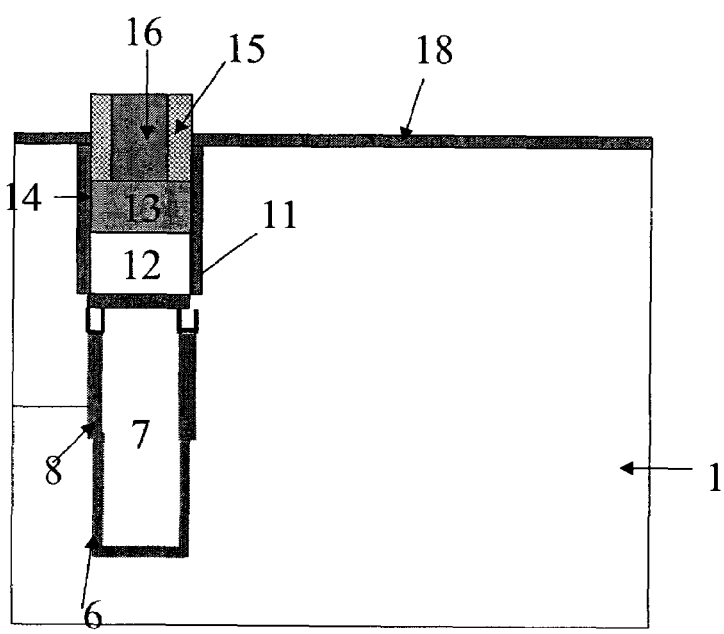

Next, referring to FIG. 3S, the array top oxide 26, the pad nitride 19 and the spacer 25 are removed by wet chemical etch, leaving polysilicon 16 laterally exposed. Another SiN spacer 15 is then formed by deposition, as shown in FIG. 3T. The nitride spacer is grown by CVD and etched by RIE. The nitride RIE stops on the pad oxide 18.

Figure 3U:
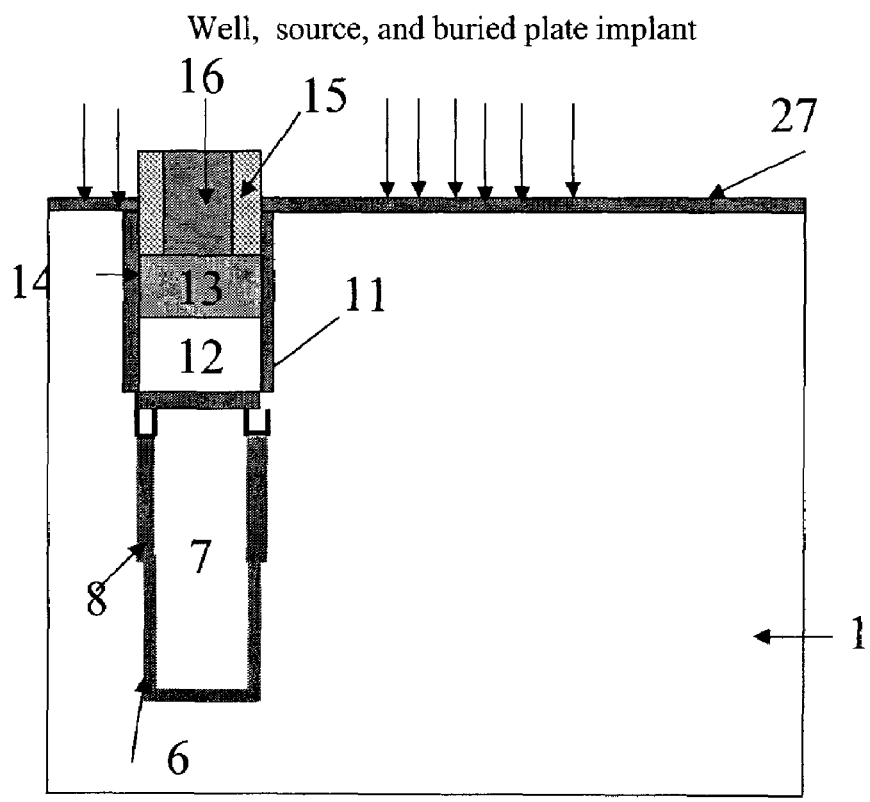
Figure 3V:
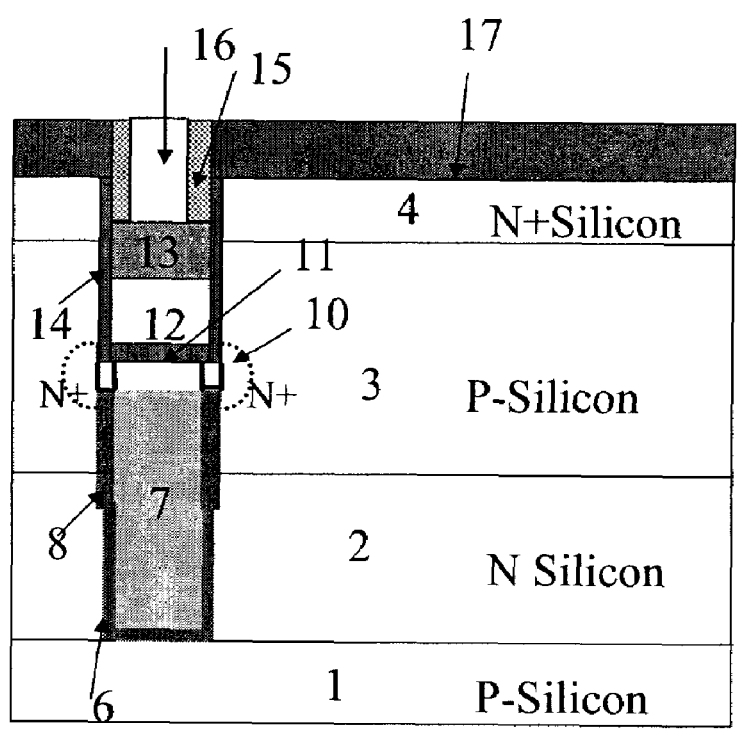

In FIG. 3U, the pad oxide 18 is stripped by wet etch, and replaced in a furnace by another screen oxide grown thereon. As shown in FIG. 3V, buried plate 2, channel 3 and bit line diffusion (source) 4 are formed by ion implant through a screen oxide. Finally, the screen oxide layer is complemented by a supplemental array top oxide 17 deposited by CVD and planarized, as shown in FIG. 3V.

This description completes the fabrication of the vertical pass transistor deep trench capacitor DRAM cell. The remaining process steps support the circuit fabrication, including the interconnect wiring to form a DRAM cell, all of which are known in the art and which will not be described herein.

In summary, the novel vertical pass transistor device structure with dual work function materials provides a gate material near the storage node having a low work function. The present invention employs N+ polysilicon as this first gate material 12, as shown, for instance, in FIG. 3V, although other materials having a low work function can be used with equal success. The second gate material, e.g., 13 in FIG. 3V has a higher work function compared to gate material 12. Possible materials are listed in Table 1, although the list is not restricted to only the materials listed therein.

Generally, the method of fabricating dual work function material pass transistor on deep trench capacitor consists of first gate material 12 (i.e., N+ poly) to be deposited by in-situ doping CVD. Gate material 12 is first planarized by CMP, with the CMP process stopping at the oxide above the pad nitride. The material is recessed by RIE, after which another gate material 13 is deposited by CVD, planarized by CMP and recessed by RIE.

While the present invention has been described in terms of several embodiments, those skilled in the art will realize that various changes and modifications can be made to the subject matter of the present invention all of which fall within the scope and the spirit of the appended claims.

The invention claimed is:

1. A method of fabricating a DRAM cell comprising the steps of:

forming a deep trench capacitor within a substrate, said deep trench being partially filled with polysilicon and topped by a trench top oxide;

forming a vertical transistor by diffusing a drain adjoining to the outer surface of said deep trench and contiguous to said trench top oxide;

forming said vertical transistor gate oxide on the walls of said deep trench;

filling the upper portion of said deep trench with a first gate material to a first height of said deep trench, and a second gate material on top of said first gate material, said second gate material only partially filling said deep trench to a second height of said deep trench, said first and second heights being less than the total depth of said deep trench;

forming spacers on the exposed walls of said deep trench;

filling the remainder of said deep trench contacting said second gate material with conductive material, an uppermost gate material being surrounded by said spacers; and successively implanting into said substrate a buried plate, a well, and a transistor source.

2. The method as recited in claim 1 wherein said first and second gate materials have respectively different work functions.

3. The method as recited in claim 1, wherein N+ in-situ doped polysilicon is deposited at the bottom of said deep trench by chemical-vapor deposition and recessed by reactive ion etch to a predetermined depth that determines the channel length of said vertical transistor.

4. The method as recited in claim 1, wherein said oxide layer deposited around a sidewall of said deep trench above said polysilicon forms a collar oxide, providing vertical isolation between said deep trench and said vertical transistor.

5. The method as recited in claim 4, wherein said gate oxide layer is formed by furnace dry oxidation.

6. The method as recited in claim 4 wherein an in-situ doped n+ polysilicon is deposited by chemical vapor deposition and planarized by way of chemical mechanical polishing; said oxide layer acting as a stop layer for said planarization of said polysilicon.

7. The method as recited in claim 1 wherein said uppermost gate material has a higher work function than the lowermost gate material, said uppermost gate material being deposited by chemical vapor deposition.

8. The method as recited in claim 7 wherein the topmost surface is planarized by chemical mechanical polishing, said oxide layer acting as a stop layer for the planarization of said uppermost gate material.

* * * * *